(12) United States Patent
Suzuki et al.

(10) Patent No.: US 9,598,792 B2
(45) Date of Patent: Mar. 21, 2017

(54) FILM-FORMING APPARATUS AND FILM-FORMING METHOD

(75) Inventors: Kunihiko Suzuki, Shizuoka (JP); Hideki Ito, Kanagawa (JP); Naohisa Ikeya, Kanagawa (JP); Hidekazu Tsuchida, Kanagawa (JP); Isaho Kamata, Tokyo (JP); Masahiko Ito, Kanagawa (JP); Masami Naito, Aichi (JP); Hiroaki Fujibayashi, Kanagawa (JP); Ayumu Adachi, Aichi (JP); Koichi Nishikawa, Aichi (JP)

(73) Assignees: NuFlare Technology, Inc., Numazu-shi (JP); Central Research Institute of Electric Power Industry, Tokyo (JP); Denso Corporation, Kariya-shi (JP); Toyota Jidosha Kabushiki Kaisha, Toyota-shi (JP)

(*) Notice: Subject to any disclaimer, the term of this patent is extended or adjusted under 35 U.S.C. 154(b) by 757 days.

(21) Appl. No.: 13/527,198

(22) Filed: Jun. 19, 2012

(65) Prior Publication Data

US 2012/0325138 A1    Dec. 27, 2012

(30) Foreign Application Priority Data

Jun. 21, 2011 (JP) .................. 2011-137839
Jun. 15, 2012 (JP) .................. 2012-135435

(51) Int. Cl.
*C30B 25/10*    (2006.01)

(52) U.S. Cl.
CPC .................. *C30B 25/10* (2013.01)

(58) Field of Classification Search
CPC ......... C30B 25/02; C30B 25/08; C30B 25/10; C30B 25/14
See application file for complete search history.

(56) References Cited

U.S. PATENT DOCUMENTS 6,627,859 B1 *   9/2003   Kasai .............. G05D 23/1902
                                                    219/438

FOREIGN PATENT DOCUMENTS

JP        63-232422       9/1988
JP        5-152207        6/1993
                   (Continued)

OTHER PUBLICATIONS

Korean Office Action issued Jan. 10, 2014, in Korea Patent Application No. 10-2012-0066685 (with English translation).

(Continued)

*Primary Examiner* — Robert M Kunemund
(74) *Attorney, Agent, or Firm* — Oblon, McClelland, Maier & Neustadt, L.L.P.

(57) ABSTRACT

A film-forming apparatus and method comprising a film-forming chamber for supplying a reaction gas into, a cylindrical shaped liner provided between an inner wall of the film-forming chamber and a space for performing a film-forming process, a main-heater for heating a substrate placed inside the liner, from the bottom side, a sub-heater cluster provided between the liner and the inner wall, for heating the substrate from the top side, wherein the main-heater and the sub-heater cluster are resistive heaters, wherein the sub-heater cluster has a first sub-heater provided at the closest position to the substrate, and a second sub-heater provided above the first sub-heater, wherein the first sub-heater heats the substrate in combination with the main-heater, the second sub-heater heats the liner at a lower output than the first sub-heater, wherein each temperature of the main-heater, the first sub-heater, and the second sub-heater is individually controlled.

15 Claims, 1 Drawing Sheet

(56) References Cited

FOREIGN PATENT DOCUMENTS

| | | |
|---|---|---|
| JP | 5-206047 | 8/1993 |
| JP | 2000-235886 | 8/2000 |
| JP | 2004/260174 | 9/2004 |
| JP | 2007-042951 | 2/2007 |
| JP | 2009-027021 | 2/2009 |
| JP | 2009-170676 | 7/2009 |
| JP | 2009-260291 | 11/2009 |
| JP | 2011-038149 | 2/2011 |

OTHER PUBLICATIONS

Office Action issued Jun. 27, 2013 in Korean Patent Application No. 10-2012-0066685 (with English translation).
Office Action mailed Feb. 12, 2016 in Japanese Application No. 2012-135435 filed Jun. 15, 2012 (w/English translation).

* cited by examiner

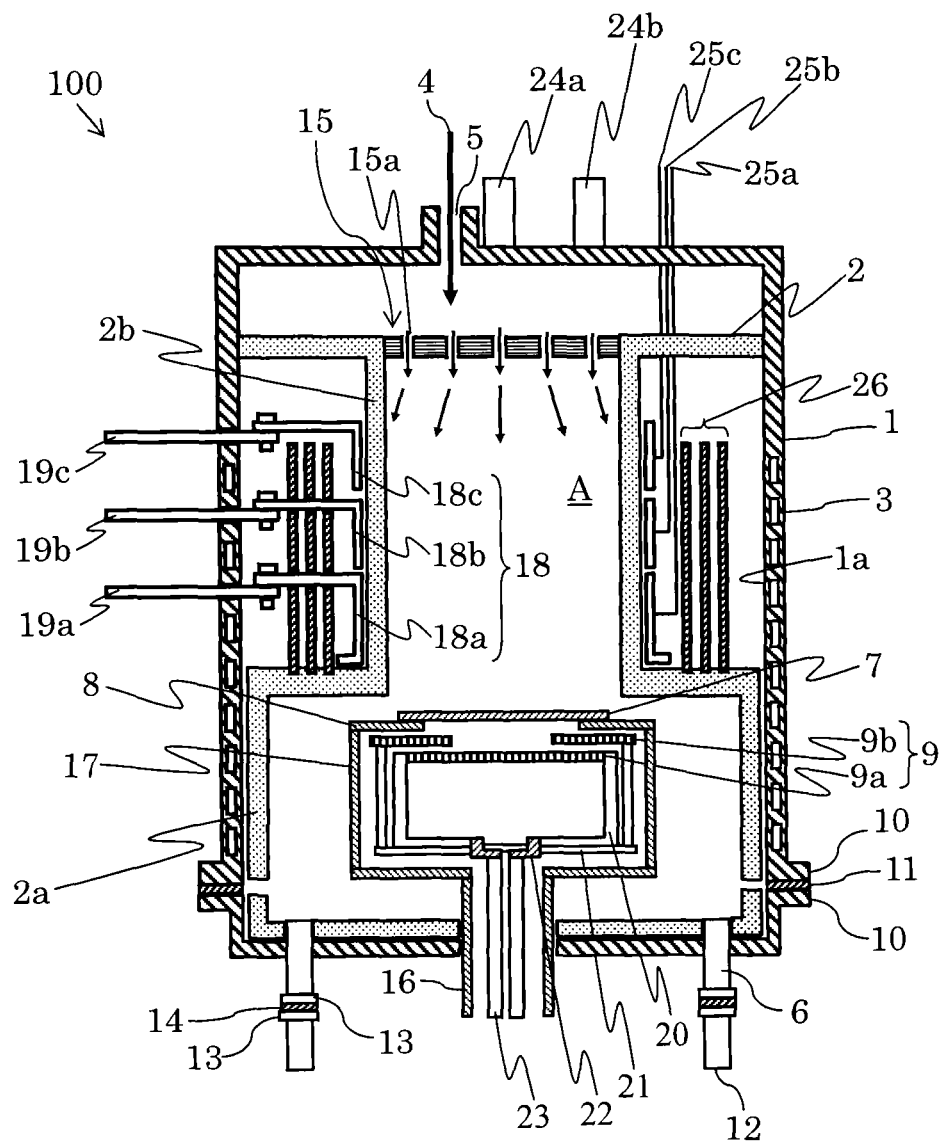

FILM-FORMING APPARATUS AND FILM-FORMING METHOD

CROSS-REFERENCE TO THE RELATED APPLICATION

The entire disclosure of the Japanese Patent Applications No. 2011-137839, filed on Jun. 21, 2011 and No. 2012-135435, filed on Jun. 15, 2012 including specification, claims, drawings, and summary, on which the Convention priority of the present application is based, are incorporated herein in its entirety.

FIELD OF THE INVENTION

The present invention relates to a film-forming apparatus and a film-forming method.

BACKGROUND

Epitaxial growth technique is conventionally used to produce a semiconductor device such as a power device (e.g., IGBT (Insulated Gate Bipolar Transistor)) requiring a relatively thick crystalline film.

In the case of vapor phase epitaxy used in an epitaxial growth technique, a substrate is placed inside a film-forming chamber maintained at an atmospheric pressure or a reduced pressure, and a reaction gas is supplied into the film-forming chamber while the substrate is heated. As a result of this process, a pyrolytic reaction or a hydrogen reduction reaction of the reaction gas occurs on the surface of the substrate so that an epitaxial film is formed on the substrate. The gas generated by the reaction, as well as the gas not used, is exhausted through the outer portion of the chamber. After the epitaxial film is formed on the substrate, the substrate is then carried out from the chamber. Another substrate is then placed into the chamber, and then an epitaxial film will be formed on that substrate.

In order to produce a thick epitaxial film in high yield, a fresh reaction gas needs to be continuously brought into contact with the surface of a uniformly heated substrate to increase a film-forming rate. Therefore, in the case of a conventional film-forming apparatus, a film is epitaxially grown on a wafer while the wafer is rotated at a high speed (see, for example, Japanese Patent Application Laid-Open No. 2009-170676).

In a conventional film-forming apparatus, a rotating unit is positioned in a film-forming chamber, and a substrate is positioned on a ring-shaped holder arranged on the top-surface of the rotating unit. A resistive heater functioning as an inner heater is positioned below the holder. This heater is a spiral-shaped structure made from carbon. Terminals and wires for supplying current, and electrodes for supporting the heater are arranged in a rotating shaft, the rotating shaft is a part of the rotating unit.

The substrate is heated via radiant heat from the inner heater. However the temperature of the outer periphery of the substrate is lower than the inner periphery, as the reaction gas rapidly flows at the outer periphery of the substrate and the radiation heat is lost as a result of cooling water in the outer wall of the film-forming chamber used to cool the apparatus. Therefore the inner heater consists of an in-heater and an out-heater, and the temperature of the out-heater is higher than the temperature of the in-heater thereby maintaining the substrate at a consistent temperature. Japanese Patent Application Laid-Open No. 2009-170676 mentions an outer heater arranged between the rotating unit and the inner wall of the film-forming chamber thereby extending the life of the out-heater.

In recent years, attention has been given to SiC (silicon carbide) as a semiconductor material to be used in high-voltage power semiconductor devices. SiC is characterized in that its energy gap is two or three times larger, and its dielectric breakdown field is about one digit larger than that of a conventional semiconductor material such as Si (silicon) or GaAs (gallium arsenide).

When mono-crystalline film made from SiC is formed on the substrate, the substrate will be heated to over 1500° C. Japanese Patent Application Laid-Open No. 2009-170676 mentions a method for heating from the bottom side of the substrate but there is a difficulty in maintaining this high temperature.

Another method for heating from top and bottom sides of the substrate is known. According to this method, the substrate is heated by a conventional inner heater, and an upper heater is arranged in the side wall of the upper part of the film-forming chamber. The inner heater is a resistive heater, and the upper heater is a high-frequency induction heater.

In the conventional method for heating the back side of the substrate, when the temperature of the substrate is over 1500° C., the temperature of the heater needs to be over 2000° C. In the resistive heater, a capacity for heat-resistance of the material used for electrically connecting the heater to the electrode is low, therefore it is difficult for the properties of the heater to be maintained at the above-mentioned high temperature. Accordingly, the upper heater is provided to heat the substrate in collaboration with the inner heater, further, the high-frequency inducted heater is used as the upper heater. Therefore, the substrate can be heated to a temperature over 1500° C.

In the high-frequency inducted heater, the heating effectiveness depends on the distance from the substrate. The temperature of the substrate is controlled using this property. Specifically, the heating temperature is controlled by adjusting the position and height of the heater coil, which is a part of the heater. However, with this method it is difficult to perform precise control of the temperature. That is, the resistive heater can only perform a minor degree of control of the temperature of the substrate, but the temperature can only be controlled to a much larger degree when the resistive heater and the high-frequency inducted heater are used.

Also, the upper heater cannot efficiently heat the substrate positioned below the upper heater as the heat dissipates into the upper part of the chamber. Moreover the construction of the upper part of the film-forming chamber, specifically a liner between the inner wall of the film-forming chamber and space in which the film-forming process performs, would crack because of the temperature difference between the inner wall and the space, by the upper heater.

The present invention has been made to address the above issues. That is, an object of the present invention is to provide a film-forming apparatus and a film-forming method that can prevent cracks in a liner and can efficiently and precisely heat a substrate, and can control the temperature of the substrate.

Other challenges and advantages of the present invention are apparent from the following description.

SUMMARY OF THE INVENTION

The present invention relates to a film-forming apparatus and film-forming method.

A first embodiment comprising a film-forming apparatus; a film-forming chamber, a cylindrical shaped liner provided between an inner wall of the film-forming chamber and a space for performing a film-forming process, a main-heater for heating a substrate placed inside the liner, from the bottom side, a sub-heater cluster provided between the liner and the inner wall, for heating the substrate from the top side, wherein the main-heater and the sub-heater cluster are resistive heaters, wherein the sub-heater cluster has a first sub-heater provided at the closest position to the substrate, and a second sub-heater provided above the first sub-heater, wherein the first sub-heater heats the substrate in combination with the main-heater, the second sub-heater heats the liner at a lower output than the first sub-heater, wherein each temperature of the main-heater, the first sub-heater, and the second sub-heater is individually controlled.

Further to the first embodiment of this invention; at least one other sub-heater for heating the liner at a lower output than the first sub-heater, wherein the other sub-heater is provided above the second sub-heater, and the temperature of the other sub-heater is controlled independently of the first sub-heater and the second sub-heater.

Further to the first embodiment of this invention; wherein the main-heater has a disk-shaped in-heater, a ring-shaped out-heater provided above the in-heater and at the position corresponding to the periphery of the substrate, wherein each temperature of the in-heater and the out-heater are individually controlled.

Further to the first embodiment of this invention; at least one other sub-heater for heating the liner at a lower output than the first sub-heater, wherein the other sub-heater is provided above the second sub-heater, and the temperature of the other sub-heater is controlled independently of the first sub-heater and the second sub-heater.

In a second embodiment of this invention, a method for forming a film comprising; placing a substrate in a liner provided between an inner wall of a film-forming chamber and a space for performing the film-forming process in the film-forming chamber, heating the substrate to form a film onto the surface of the substrate, wherein the substrate is heated by a main-heater from the bottom side, a first sub-heater, provided at the closest position to the substrate, between the liner and the inner wall, used for heating the substrate from the top side, wherein a second sub-heater, provided above the first sub-heater, heats the liner at a lower output than the first sub-heater, during the film forming on the surface of the substrate.

Further to the second embodiment of this invention; wherein the output of the main-heater is controlled depending on the temperature of the substrate, and the output of the first sub-heater is controlled depending on the output of the main-heater.

In a third embodiment of this invention, a film-forming apparatus comprising; a film-forming chamber, a cylindrical shaped liner provided between an inner wall of the film-forming chamber and a space for performing a film-forming process, a main-heater for heating a substrate placed inside the liner, from the bottom side, a sub-heater cluster provided between the liner and the inner wall, for heating the substrate from the top side, wherein the main-heater and the sub-heater cluster are resistive heaters, wherein the sub-heater cluster has a first sub-heater provided at the closest position to the substrate, and a second sub-heater provided above the first sub-heater, wherein the first sub-heater heats the substrate in combination with the main-heater, the second sub-heater heats the liner at the same output as the first sub-heater, wherein each temperature of the main-heater, the first sub-heater, and the second sub-heater is individually controlled.

Further to the third embodiment of this invention, a film-forming apparatus, further comprising; at least one other sub-heater for heating the liner is at the same output as the first sub-heater, wherein the other sub-heater is provided above the second sub-heater, and the temperature of the other sub-heater is controlled independently of the first sub-heater and the second sub-heater.

Further to the third embodiment of this invention, a film-forming apparatus wherein the main-heater has a disk-shaped in-heater, a ring-shaped out-heater provided above the in-heater and at the position corresponding to the periphery of the substrate, wherein each temperature of the in-heater and the out-heater are individually controlled.

Further to the third embodiment of this invention, a film-forming apparatus, further comprising; at least one other sub-heater for heating the liner at the same output as the first sub-heater, wherein the other sub-heater is provided above the second sub-heater, and the temperature of the other sub-heater is controlled independently of the first sub-heater and the second sub-heater.

In a fourth embodiment of this invention, a method for forming a film comprising; placing a substrate in a liner provided between an inner wall of a film-forming chamber and a space for performing the film-forming process in the film-forming chamber, heating the substrate to form a film onto the surface of the substrate; wherein the substrate is heated by a main-heater from the bottom side; a first sub-heater, provided at the closest position to the substrate, between the liner and the inner wall, used for heating the substrate from the top side, wherein a second sub-heater, provided above the first sub-heater, heats the liner at the same output as the first sub-heater, during the film forming on the surface of the substrate Further to the fourth embodiment of this invention; wherein the output of the main-heater is controlled depending on the temperature of the substrate, the output of the first sub-heater is controlled depending on the output of the main-heater.

In a fifth embodiment of this invention, a film-forming apparatus comprising; a film-forming chamber, a cylindrical shaped liner provided between an inner wall of the film-forming chamber and a space for performing a film-forming process, a main-heater for heating a substrate placed inside the liner, from the bottom side, a sub-heater cluster provided between the liner and the inner wall, for heating the substrate from the top side, wherein the main-heater and the sub-heater cluster are resistive heaters, wherein the sub-heater cluster has a first sub-heater provided at the closest position to the substrate, and a second sub-heater provided above the first sub-heater, wherein the first sub-heater heats the substrate in combination with the main-heater, the surface of the second sub-heater heats the liner at the same temperature, or lower temperature, than the surface of first sub-heater, wherein each temperature of the main-heater, the first sub-heater, and the second sub-heater is individually controlled.

Further to the fifth embodiment of this invention, a film-forming apparatus further comprising; at least one other sub-heater for heating the liner at the same temperature, or a lower temperature, than the surface of first sub-heater, wherein the other sub-heater is provided above the second sub-heater, and the temperature of the other sub-heater is controlled independently of the first sub-heater and the second sub-heater.

Further to the fifth embodiment of this invention; a film-forming apparatus wherein the main-heater has a disk-shaped in-heater, a ring-shaped out-heater provided above the in-heater and at the position corresponding to the periphery of the substrate, wherein each temperature of the in-heater and the out-heater are individually controlled.

Further to the fifth embodiment of this invention, a film-forming apparatus further comprising; at least one other sub-heater for heating the liner at the same temperature, or a lower temperature, than the surface of first sub-heater, wherein the other sub-heater is provided above the second sub-heater, and the temperature of the other sub-heater is controlled independently of the first sub-heater and the second sub-heater.

In a sixth embodiment of this invention, a method for forming a film comprising; placing a substrate in a liner provided between an inner wall of a film-forming chamber and a space for performing the film-forming process in the film-forming chamber, heating the substrate to form a film onto the surface of the substrate, wherein the substrate is heated by a main-heater from the bottom side, a first sub-heater, provided at the closest position to the substrate, between the liner and the inner wall, used for heating the substrate from the top side, wherein a second sub-heater provided above the first sub-heater heats the liner at the same temperature, or a lower temperature, than the surface of first sub-heater while the film is formed onto the surface of the substrate.

Further to the sixth embodiment of this invention, a method for forming a film, wherein the temperature of the surface of the main-heater is controlled depending on the temperature of the substrate, the temperature of the surface of the first sub-heater is controlled depending on the temperature of the surface of the main-heater.

BRIEF DESCRIPTION OF THE DRAWINGS

FIG. 1 is a schematic cross section of a film-forming apparatus according to the present embodiment.

DETAILED DESCRIPTION OF THE INVENTION

FIG. 1 is a schematic cross section of a film-forming apparatus according to the present embodiment. In this diagram, some components are omitted except the necessary components to explain the present embodiment. The scale of this diagram is different from an actual apparatus so that each component is visible clearly.

As shown in FIG. 1, the film-forming apparatus 100 includes a chamber 1 as a film-forming chamber, a hollow tubular liner 2 that covers and protects the inner wall of the chamber 1, flow paths 3 through which cooling water flows to cool the chamber 1, a supply portion 5 for introducing a reaction gas 4, a discharge portion 6 that discharges the reaction gas 4 subjected to reaction, a susceptor 8 that supports the substrate 7 placed thereon, a flange portion 10 that connects upper and lower sections of the chamber 1 with each other, a gasket 11 that seals the flange portion 10, a flange portion 13 that connects the gas discharge portion 6 to a pipe 12, the pipe 12 is used for discharging the gas out of the chamber 1, and a gasket 14 that seals the flange portion 13. These gaskets 11 and 14 are preferably made of fluorine-containing rubber, which have an allowable temperature limit of approximately 300° C.

The liner 2 is provided to separate the inner wall 1a of the chamber 1 from the space A in which the film will be formed on the substrate 7. The inner wall 1a of the chamber 1 is made of stainless steel. Therefore, the liner 2 has the effect of preventing erosion of the inner wall 1a of the chamber 1 by the reaction gas 4.

The liner 2 is made of a material having very high heat resistance, as the film-forming process is performed under high temperature. For example, a SiC member or a member formed by coating carbon with SiC can be used.

In the present embodiment, the liner 2 is separated into a body portion 2a and a top portion 2b for ease of explanation. The top portion 2b is a part in which the susceptor 8 is placed. The top portion 2b has a smaller inner diameter than the body portion 2a. The liner 2 consists of the body portion 2a and the top portion 2b combined into one whole portion. The top portion 2b is positioned above the body portion 2a.

A shower plate 15 is fitted into the upper opening of the top portion 2b. The shower plate 15 functions as a flow-straightening vane for uniformly supplying the reaction gas 4 to the surface of the substrate 7. The shower plate 15 has a plurality of through-holes 15a thereon. When the reaction gas 4 is supplied from the supply portion 5 into the film-forming chamber 1, the reaction gas 4 flows downward to the substrate 7 through the through-holes 15a. It is preferable that the reaction gas 4 be efficiently focused on the surface of the substrate 7 without wastage. Accordingly, the inner diameter of the top portion 2b is designed so as to be smaller than the body portion 2a. Specifically the inner diameter of the top portion 2b is determined in consideration of the position of the through-holes 15a and the size of the substrate 7.

The susceptor 8 for supporting the substrate 7 is positioned in the film-forming chamber 1, specifically, in the body portion 2a of the liner 2. In order to form a SiC epitaxial film, the temperature of the substrate 7 needs to be 1500° C. or higher. For this reason, the susceptor 8 needs to be made of highly heat-resistant material. A susceptor 8 obtained by coating the surface of isotropic graphite with SiC by CVD (Chemical Vapor Deposition) can be used (as one example). The shape of the susceptor 8 is not particularly limited as long as the substrate 7 can be placed on the susceptor 8, and may be designed as required. Examples can include a ring shape and a solid disk shape.

The rotating shaft 16 and the rotating cylinder 17 positioned on the top of the rotating shaft 16 are placed in the body portion 2a of the liner 2. The susceptor 8 is attached to the rotating cylinder 17. The rotating shaft 16 is rotated, and then the susceptor 8 is rotated via the rotating cylinder 17. When the film-forming process is performed, the substrate 7 is placed on the susceptor 8, and the substrate 7 is rotated along with the susceptor 8.

The reaction gas 4 passing through the shower plate 15, flows downward toward the substrate 7 via the top portion 2b. The reaction gas 4 is attracted by the substrate 7 while the substrate 7 is rotating, and the reaction gas 4 forms a so-called vertical flow in a region extending from the shower plate 15 to the surface of the substrate 7. When the reaction gas 4 reaches the substrate 7, the reaction gas 4 flows without turbulence as a substantially laminar flow in a horizontal direction along the upper surface of the substrate 7. As described above, the reaction gas 4 comes into contact with the surface of the substrate 7, and an epitaxial film is formed on the surface of the substrate 7 by a pyrolytic reaction or a hydrogen reduction of the reaction gas 4 on the surface of the substrate 7. Furthermore, the film-forming apparatus 100 is configured so that the gap between the periphery of the substrate 7 and the liner 2 is minimized to allow the reaction gas 4 to flow more uniformly onto the surface of the substrate 7.

The reaction gas 4 not used for the vapor-phase growth reaction and the gas produced by the epitaxial reaction, is exhausted from the discharge portion 6 provided at the bottom of the chamber 1.

According to the above-mentioned apparatus, the vapor-phase growth reaction is performed while the substrate 7 is rotated. The reaction gas 4 can be efficiently supplied over the whole surface of the substrate 7, and then an epitaxial film having high thickness uniformity is formed. It is noted that the film-forming rate can be increased when reaction gas 4 is continuously supplied to the surface of the substrate 7.

The substrate 7 must be heated to form the epitaxial film thereon. In order to form a SiC epitaxial film, the temperature of the substrate 7 needs to reach 1650° C. or higher. In the present embodiment, the substrate 7 is heated by a main-heater 9 and sub-heater 18. Both of these are resistive heaters.

The main-heater 9 is provided in the rotating cylinder 17, and heats the substrate 7 from the bottom side of the substrate 7. The main-heater 9 directly affects the temperature of the substrate 7. The main-heater 9 has a disk shaped in-heater 9a and a ring shaped out-heater 9b. The in-heater 9a is placed at the position corresponding to the substrate 7. The out-heater 9b is placed above the in-heater 9a, and at the position corresponding to the outer periphery of the substrate 7. As the temperature of the outer periphery of the substrate 7 is lower than the inner periphery, the combination of an in-heater 9a and an out-heater 9b can prevent a drop in temperature of the outer periphery and thus maintain a consistent temperature across the substrate 7.

The in-heater 9a and the out-heater 9b are supported by an electrically conductive arm-like busbar 20. The busbar 20 is made of, for example, a SiC-coated carbon material. The busbar 20 is supported by the heater base 21 made of quartz, at the opposite side of the in-heater 9a and the out-heater 9b. The busbar 20 is connected to connecting portions 22. The connecting portions 22 are formed of a metal such as molybdenum. Electricity can be conducted from rod electrodes 23 through the busbar 20 to the in-heater 9a and the out-heater 9b. Specifically, electricity is conducted from the rod electrodes 23 to a heat source of the in-heater 9a and the out-heater 9b, and then the temperature of the heat source will increase.

The sub-heater 18 is comprised of multiple resistive heaters, for example three heaters, that is, first sub-heater 18a, second sub-heater 18b and third sub-heater 18c in the present embodiment. The sub-heater 18 doesn't need to include the third sub-heater 18c. Further, the sub-heater 18 can have one or more other sub-heaters provided above the third sub-heater 18c. This combination of one or more sub-heaters is hereinafter referred to as a cluster of sub-heaters.

The first sub-heater 18a, the second sub-heater 18b and the third sub-heater 18c are provided around the top portion 2b of the liner 2, and are supported by the first heater supporting portion 19a, second heater supporting portion 19b and third heater supporting portion 19c respectively, each heater is connected with each supporting portion by connecting portions (not shown). The distance between each heater can be modified by changing the distance between each supporting portion.

Furthermore, the first heater supporting portion 19a, the second heater supporting portion 19b and the third heater supporting portion 19c are respectively connected through the side-wall of the chamber 1 to an outer electrode. Therefore, electricity can be individually conducted from the outer electrode through each supporting portion to each heater. As a result, each heater can be individually controlled.

The first sub-heater 18a is provided at the lowest position of the sub-heater 18 and is closest to the substrate 7 in the sub-heater 18. The substrate 7 is heated from the top surface by the first sub-heater 18a. The back surface of the substrate 7 is heated is also heated from the back surface by main-heater 9. That is, the substrate 7 is heated from both sides by the main-heater 9 and the first sub-heater 18a. As these heaters are the resistive heaters, the temperature of the substrate 7 can be precisely controlled.

The second sub-heater 18b is provided above the first sub-heater 18a. The third sub-heater 18c is provided above the second sub-heater 18b. The second sub-heater 18b heats the top portion 2b with less output and as a result the heat emitted from the second sub-heater 18b is lower than the heat emitted from the first sub-heater 18a. The third sub-heater 18c heats the top portion 2b with less output than the second sub-heater 18b. That is, when the top portion 2b is heated, the output of the first sub-heater 18a can be the same as the output of the second sub-heater 18b and the third sub-heater 18c.

As the above-mentioned, the sub-heater 18 is the resistive heater. Therefore, the first sub-heater 18a heats the top portion 2b, and then the substrate 7 is heated by the heat of the top portion 2b. When the sub-heater 18 consists of only the first sub-heater 18a, this heater can heat only a small section of the top portion 2b. That is, the temperature of the top portion 2b is distributed to the lower temperature part, specifically to the upper side of the top portion 2b. Accordingly, in this case, the substrate 7 cannot be efficiently heated by the heat of the top portion 2b.

The second sub-heater 18b and the third sub-heater 18c can prevent the loss of the heat from the first sub-heater 18a to the upper side of the top portion 2b. That is, these heaters can decrease the difference of the temperature of the top portion 2b of the liner 2. Therefore, the substrate 7 can be efficiently heated by the first sub-heater 18a. Furthermore, the combination of heaters can prevent a crack in the liner 2 caused by the difference of the temperature of the top portion 2b. The distribution of the temperature of the top portion 2b can be controlled by changing each temperature that is set in the first sub-heater 18a, the second sub-heater 18b and the third sub-heater 18c, and the distance between these heaters.

The surface temperature of the substrate 7 is measured by radiation thermometers 24a and 24b. In FIG. 1, the temperature at the center of the substrate 7 is measured by the radiation thermometer 24a. The temperature of the outer position of the substrate 7 is measured by the radiation thermometer 24b. These radiation thermometers are positioned at the upper position of the film-forming chamber 1 as shown in FIG. 1. It is preferred that the shower plate 15 be formed of quartz, because the use of quartz prevents the temperature measurement of the radiation thermometers 24a and 24b from being affected.

After temperature measurement the data is sent to a control unit (not illustrated) and then fed back to an output control unit of the in-heater 9a and the out-heater 9b. The output of the first sub-heater 18a is controlled depending on the output of the in-heater 9a and out-heater 9b. The output of the second sub-heater 18b is controlled so as to be lower than the output of the first sub-heater 18a. The output of the third sub-heater 18c is controlled so as to be lower than the output of the second sub-heater 18b. Therefore, the substrate 7 can be efficiently heated to the desired temperature without the liner 2 cracking. Each heater can be controlled by not only the output of each sub-heater, but also the temperature of the surface of the sub-heaters. Furthermore, the temperature of the surface of the main-heater 9 can be controlled based on the temperature of the substrate 7. Moreover, the temperature of the surface of the first sub-heater 18a can be controlled based on the temperature of the surface of the main-heater 9.

As an example, each temperature of these heaters can be set as follows, when SiC epitaxial film is formed on the substrate 7. Thereby the substrate 7 can be heated approximately 1650° C.

Temperature of in-heater 9a: 1680° C.
Temperature of out-heater 9b: 1750° C.
Temperature of first sub-heater 18a: 1650° C.
Temperature of second sub-heater 18b: 1600° C.
Temperature of third sub-heater 18c: 1550° C.

In the present embodiment, the first sub-heater 18a is provided at the lowest position of the top portion 2b of the liner 2, namely, at the position connected with the body portion 2a. The liner 2 is angled near the border between the top portion 2b and the body portion 2a. Therefore the shape of the first sub-heater 18a, as shown in FIG. 1, is preferred to be along the liner 2 that has an angled shape. Thus the substrate 7 can be efficiently heated as the substrate 7 is positioned at the body portion 2a.

As mentioned above, the film-forming apparatus 100 according to the present embodiment, has the main-heater 9 and sub-heater 18. Thereby having the following effect.

The main-heater 9 and the sub-heater 18 can perform minor control of the temperature because both of them are resistive heaters. If the heaters are high-frequency inducted heaters, the temperature is controlled by the distance between the heaters and the substrate 7. Therefore it is difficult to perform minor control of the temperature of the substrate 7. Even if the heaters are a combination of a resistive heater and a high-frequency inducted heater, it is still difficult to perform minor control of the temperature of the substrate 7. However, in the present embodiment, the heater for heating from the back side of the substrate 7, and the heater for heating from the top side of the substrate 7 are the resistive heaters. Therefore, the temperature of the substrate can be precisely controlled.

The main-heater 9 heats from the back side of the substrate 7. The sub-heater 18 heats from the top side of the substrate 7. The main-heater 9 provided in close proximity to the substrate 7 mainly heats the substrate 7. The sub-heater 18 assists the main-heater 9. Therefore the temperature of the main-heater 9 should be set at a higher temperature than the sub-heater 18. However, it can avoid imposing an excessive burden on the main-heater 9 by providing the sub-heater 18. If there is only the main-heater 9, the temperature of the main-heater 9 needs to be increased to about 2000° C. when the substrate 7 is to be heated to 1650° C. or more. It is impossible however because the heat resistance of the main-heater 9 is lower than 1650° C. In the present embodiment, as the sub-heater 18 heats the substrate 7 in combination with the main-heater 9, the temperature of the main-heater 9 can be set at a lower temperature. That is, the substrate 7 can be heated to 1650° C. without increasing the temperature of the main-heater 9 to 2000° C.

The sub-heater 18 is comprised of multiple heaters, specifically the first sub-heater 18a, the second sub-heater 18b and the third sub-heater 18c. These heaters are given a different role individually in the present embodiment. For example, the first sub-heater 18a heats from the top side of the substrate 7. The second sub-heater 18b and the third sub-heater 18c prevent the loss of heat from the first sub-heater 18a to the upper part of the chamber 1. Therefore, the substrate 7 can be efficiently heated from the top side by a combination of these heaters. Furthermore, the second sub-heater 18b and the third sub-heater 18c lower an increase in the localized area of the temperature of the top portion 2b by the first sub-heater 18a. Accordingly, the temperature of the top portion 2b can be uniform and a crack of the top portion 2b by excessive heat can be prevented.

The set temperature of each sub-heaters which is preferably determined individually is based on their role. The first sub-heater 18a heats the substrate 7 from the top surface of the substrate 7 to assist the main-heater 9. Therefore, the temperature of the first sub-heater 18a is set based on the temperature that the substrate 7 should be heated to, and the set temperature of the main-heater 9. The second sub-heater 18b and the third sub-heater 18c are provided to prevent a loss of heat from the first sub-heater 18a to the upper part of the chamber 1, and to create a uniform distribution of the temperature in the top portion 2b. Therefore, the temperature of these heaters is set based on the temperature of the first sub-heater 18a. Specifically the second sub-heater 18b is set to a lower temperature than the first sub-heater 18a. The third sub-heater 18c is set to a lower temperature than the second sub-heater 18b.

The actual temperature of each sub-heater can be measured by thermocouples 25a, 25b and 25c that are connected to these sub-heaters. The data measured by these thermocouples is sent to a control unit (not shown), and then fed back to each control unit for outputting data to the first sub-heater 18a, the second sub-heater 18b and the third sub-heater 18c. Thus the distribution of the temperature of the top portion 2b can always be within the predetermined range.

In the present embodiment, the number of heaters which form the sub-heater 18 can be changed depending on the situation. For example, the number of heaters which assist the main-heater 9 can be two or more. Furthermore, the number of sub-heaters can be more than three, there can be a fourth and fifth sub-heater, as one example. Each heater is individually controlled via their supporting portions in spite of the quantity of sub-heaters. The temperature can be more precisely controlled by increasing the heaters.

In the present embodiment it is preferable to provide a reflector 26 to efficiently heat via the sub-heater 18 as shown in FIG. 1.

In FIG. 1, the sub-heater 18 is provided around the top portion 2b of the liner 2. The reflector 26 is provided outside of the sub-heater 18. Specifically, the heating surface of the sub-heater 18 faces the top portion 2b, and the reflector 26 is provided at the opposite side of the heating surface. Therefore the heat from the heating surface reflected to the opposite side of the top portion 2b, can be reflected to the top portion 2b by the reflector 26.

The reflector 26 is constructed from a material with a high heat resistance and high thermal conductivity such as carbon. The reflector 26 can consist of a thin carbon plate, but it is preferable to consist of a plurality of thin carbon plates provided at preferable spaces to increase the reflection efficiency of the heat from the heater. For example, FIG. 1 shows the reflector 26 consisting of three thin carbon plates provided at equal spaces.

The reflector 26 can prevent the increase of the temperature of the inner wall 1a of the chamber 1 by the heat from the sub-heater 18. Moreover, it is effective to provide an insulator along the inner wall 1a of the chamber 1 to prevent an increase of the temperature of the inner wall 1a. As the insulator can insulate conduction of the heat from the sub-heater 18, it can prevent an increase of the temperature of the inner wall 1a. Therefore, the combination of the reflector 26 and the insulator can efficiently prevent an increase of the temperature of the inner wall 1a.

Next, an example of the film-forming method in the present embodiment is described referring to FIG. 1.

The film-forming apparatus 100 according to the present embodiment is preferable for forming a SiC epitaxial film. The below-mentioned regarding the SiC epitaxial film-forming is one possible example.

For example, a SiC wafer can be used as the substrate 7. However, the substrate 7 is not limited to a SiC wafer. The material of the substrate 7 may be, for example, Si, SiO2 (quartz) or another insulator. A highly resistive semi-insulating substrate such as GaAs (gallium arsenide) can also be used.

As a reaction gas 4, for example, propane ($C_3H_8$) or silane ($SiH_4$) is used. Hydrogen gas is used as the carrier gas. In the case of the reaction gas 4, disilane ($Si_2H_6$), monochlorosilane ($SiH_3Cl$), dichlorosilane ($SiH_2Cl_2$), trichlorosilane ($SiHCl_3$) or tetrachlorosilane ($SiCl_4$) can also be used instead of silane.

Firstly, the substrate 7 is placed on the susceptor 8.

Next, the substrate 7 is rotated at atmospheric pressure or under an appropriate reduced vacuum pressure. The susceptor 8 on which the substrate 7 is placed, is positioned on the upper end of the rotating cylinder 17. When the rotating cylinder 17 is rotated via the rotating shaft 16, the susceptor 8 is rotated via the rotating cylinder 17, and consequently the substrate 7 can be rotated via the susceptor 8. The number of revolutions of the substrate 7 which can be rotated at is approximately 50 rpm.

In the present embodiment, the substrate 7 is heated by the main-heater 9 and the sub-heater 18. During the vapor-phase growth reaction for SiC film, the substrate 7 is heated at the predetermined temperature, for example, between 1500° C. and 1700° C. In one example, if the substrate 7 is heated to 1650° C., each heater will be set as follows.

Temperature of in-heater 9a: 1680° C.
Temperature of out-heater 9b: 1750° C.
Temperature of first sub-heater 18a: 1650° C.
Temperature of second sub-heater 18b: 1600° C.
Temperature of third sub-heater 18c: 1550° C.

As mentioned above, an excessive increase in the temperature of the film-forming chamber 1 can be prevented by allowing cooling water to flow through the flow path 3 provided in the wall of the chamber 1.

After it is confirmed that the temperature of the substrate 7 measured by the radiation thermometers 24a and 24b has reached a predetermined temperature, for example 1650° C., the temperature is precisely adjusted by the main-heater 9 and the sub-heater 18. The temperature can be adjusted in the desired range as these heaters are the resistive heaters.

The temperature of the substrate 7 can be measured in real time by the radiation thermometers 24a and 24b. The temperature of the sub-heater 18 can be measured by thermocouples 25a, 25b, and 25c. The temperature is set at each heater, that is, the in-heater 9a, the out-heater 9b, the first sub-heater 18a, the second sub-heater 18b and the third sub-heater 18c is adjusted based on the measurement data. Thereby the substrate 7 can be efficiently heated to the desired temperature without the possibility of the liner 2 cracking.

Specifically the temperature data measured by the radiation thermometers 24a and 24b, is sent to a control unit (not shown), and then is fed back to each control unit to control the output of the in-heater 9a and the out-heater 9b. Then, the output of the first sub-heater 18a is controlled based on the output of the in-heater 9a and out-heater 9b. Furthermore, the second sub-heater 18b is controlled to be at a lower output than the first sub-heater 18a. The third sub-heater 18c is controlled to be at a lower output than the second sub-heater 18b. The data measured by the thermocouple 25a, 25b, 25c can be used to determine the relationship between the temperature and the output of each sub-heater. As mentioned above, when the top portion 2b is heated, the output of the first sub-heater 18a can be the same as the output of the second sub-heater 18b and the third sub-heater 18c. Each sub-heater can be controlled by not only the output of each sub-heater, but also the temperature of the surface of the sub-heater. Furthermore, the temperature of the surface of the main-heater 9 can be controlled based on the temperature of the substrate 7. Moreover, the temperature of the surface of the first sub-heater 18a can be controlled based on the temperature of the surface of the main-heater 9.

After it is confirmed that the temperature of the substrate 7 has reached a predetermined temperature, the number of revolutions of the substrate 7 is gradually increased. For example, the number of revolutions of the substrate 7 can be increased to 900 rpm. The reaction gas 4 is supplied from the supply portion 5.

The reaction gas 4 passes via the through-holes 15a of the shower plate 15, and then flows into the space A in which the vapor-phase growth reaction will be performed on the substrate 7. At this time, the flow of the reaction gas 4 is straightened by the gas passing through the shower plate 15 serving as a straightening vane so that the reaction gas 4 flows substantially vertical downward toward the substrate 7 under the shower plate 15.

When the reaction gas 4 reaches the surface of the substrate 7, a thermal decomposition reaction or a hydrogen reduction reaction occurs so that a SiC epitaxial film is formed on the surface of the substrate 7. Surplus reaction gas 4 that isn't used for the vapor-phase growth reaction, and gas generated by the vapor-phase growth reaction, is discharged through the discharge portion 6 provided in the lower part of the film-forming chamber 1.

After forming a SiC film of a predetermined thickness on the substrate 7, the supply of reaction gas 4 is stopped. The gas in the film-forming chamber 1 is replaced with hydrogen gas, an inert gas and so on. The supply of the carrier gas can be stopped at the same time, alternatively, after only the supply of the reaction gas 4 is stopped, the supply of the carrier gas can be stopped after the temperature of the substrate 7 as measured by the radiation thermometer 24a and 24b becomes lower than a predetermined temperature.

After the temperature of the substrate 7 as measured by the radiation thermometer 24a and 24b is cooled to a predetermined temperature, the substrate 7 is moved out of the film-forming chamber 1.

Features and advantages of the present invention can be summarized as follows.

The present invention provides a film-forming apparatus for preventing cracks in a liner, can efficiently heat a substrate, and can precisely control the temperature of the substrate.

The present invention provides a film-forming method for preventing cracks in a liner, can efficiently heat a substrate, and can precisely control the temperature of the substrate.

The present invention is not limited to the embodiments described above and can be implemented in various modifications without departing from the spirit of the invention. For example, the above embodiment has described an example of a film-forming process while rotating the substrate in a film-forming chamber, the present invention is not limited to this. The film-forming apparatus of the present invention may be deposited on the substrate while stationary and not rotating.

In addition to the above embodiments, an epitaxial growth system cited as the example of a film-forming apparatus for forming SiC film in the present invention is not limited to this. Reaction gas supplied into the film-forming chamber for forming a film on its surface while heating the wafer, can also be applied to other apparatus such as a CVD (Chemical Vapor Deposition) film-forming apparatus, and to form other epitaxial film.

The above description of the invention has not specified apparatus constructions, control methods, etc. which are not essential to the description of the invention, since any suitable apparatus constructions, control methods, etc. can be employed to implement the invention.

Moreover, the scope of this invention encompasses all film-forming apparatus employing the elements of the invention and variations thereof, which can be designed by those skilled in the art.

What is claimed is:

1. A film-forming apparatus comprising:
a film-forming chamber;
a cylindrical shaped liner provided between an inner wall of the film-forming chamber and a space for performing a film-forming process;
a main-heater configured to heat a substrate placed inside the liner, from the bottom side;
a sub-heater cluster provided between the liner and the inner wall, apart from the innter wall and above an outer periphery of the suspector, the sub-heater cluster being configured to heat the substrate from the top side;
wherein the main-heater and the sub-heater cluster are resistive heaters;
wherein the sub-heater cluster has a first sub-heater provided at the closest position to the substrate, and a second sub-heater provided above the first sub-heater;
wherein the first sub-heater heats the substrate in combination with the main-heater, the second sub-heater heats the liner at a lower output than the first sub-heater;
wherein each temperature of the main-heater, the first sub-heater, and the second sub-heater is individually controlled.

2. The film-forming apparatus according to claim 1, wherein the main-heater has a disk-shaped in-heater;
a ring-shaped out-heater provided above the in-heater and at the position corresponding to the periphery of the substrate;
wherein each temperature of the in-heater and the out-heater are individually controlled.

3. The film-forming apparatus according to claim 1, further compromising:
at least one other sub-heater for heating the liner at a lower output than the first sub-heater;
wherein the other sub-heater is provided above the second sub-heater, and the temperature of the other sub-heater is controlled independently of the first sub-heater and the second sub-heater.

4. The film-forming apparatus according to claim 2, further comprising:
at least one other sub-heater for heating the liner at a lower output than the first sub-heater;
wherein the other sub-heater is provided above the second sub-heater, and the temperature of the other sub-heater is controlled independently of the first sub-heater and the second sub-heater.

5. A method for forming a film comprising:
placing a substrate on a susceptor in a liner provided between an inner wall of a film-forming chamber and a space for performing the film-forming process in the film-forming chamber;
heating the substrate to form a film onto the surface of the substrate;
wherein the substrate is heated by a main-heater from the bottom side, the substrate is heated by a first sub-heater from the top side, the first sub-heater is provided between the liner and the inner wall, apart from the inner wall and above an outer periphery of the susceptor;
wherein an output of the main-heater is controlled depending on the temperature of the substrate, and an output of the first sub-heater is controlled depending on the output of the main-heater; and
wherein the liner is heated by a second sub-heater at a lower output than the first sub-heater, the second sub-heater is provided between the liner and the inner wall above the first sub-heater.

6. A film-forming apparatus comprising:
a film-forming chamber;
a cylindrical shaped liner provided between an inner wall of the film-forming chamber and a space for performing a film-forming process;
a main-heater configured to heat a substrate placed on a susceptor inside the liner, from the bottom side;
a sub-heater cluster provided between the liner and the inner wall, apart from the inner wall and above an outer periphery of the susceptor, the sub-heater cluster being configured to heat the substrate from the top side;
wherein the main-heater and the sub-heater cluster are resistive heaters;
wherein the sub-heater cluster has a first sub-heater provided at the closest position to the substrate, and a second sub-heater provided above the first sub-heater;
wherein the first sub-heater heats the substrate in combination with the main-heater, the second sub-heater heats the liner at the same output as the first sub-heater;
wherein each temperature of the main-heater, the first sub-heater, and the second sub-heater is individually controlled.

7. The film-forming apparatus according to claim 6, wherein the main-heater has a disk-shaped in-heater;
a ring-shaped out-heater provided above the in-heater and at the position corresponding to the periphery of the substrate;
wherein each temperature of the in-heater and the out-heater are individually controlled.

8. The film-forming apparatus according to claim 6, further comprising:
at least one other sub-heater for heating the liner is at the same output as the first sub-heater;
wherein the other sub-heater is provided above the second sub-heater, and the temperature of the other sub-heater is controlled independently of the first sub-heater and the second sub-heater.

9. The film-forming apparatus according to claim 7, further comprising:

at least one other sub-heater for heating the liner at the same output as the first sub-heater;

wherein the other sub-heater is provided above the second sub-heater, and the temperature of the other sub-heater is controlled independently of the first sub-heater and the second sub-heater.

10. A method for forming a film comprising:

placing a substrate on a susceptor in a liner provided between an inner wall of a film-forming chamber and a space for performing the film-forming process in the film-forming chamber;

heating the substrate to form a film onto the surface of the substrate;

wherein the substrate is heated by a main-heater from the bottom side, the substrate is heated by a first sub-heater from the top side, the first sub-heater is provided and between the liner and the inner wall, apart from the inner wall and above an outer periphery of the susceptor;

wherein an output of the main-heater is controlled depending on the temperature of the substrate, and an output of the first sub-heater is controlled depending on the output of the main-heater; and wherein the liner is heated by a second sub-heater at a lower output than the first sub-heater, the second sub-heater is provided between the liner and the inner wall above the first sub-heater.

11. A film-forming apparatus comprising:

a film-forming chamber;

a cylindrical shaped liner provided between an inner wall of the film-forming chamber and a space for performing a film-forming process;

a main-heater configured to heat a substrate on a susceptor placed inside the liner, from the bottom side;

a sub-heater cluster provided between the liner and the inner wall, apart from the inner wall and above an outer periphery of the susceptor, the sub-heater cluster being configured to heat the substrate from the top side;

wherein the main-heater and the sub-heater cluster are resistive heaters;

wherein the sub-heater cluster has a first sub-heater provided at the closest position to the substrate, and a second sub-heater provided above the first sub-heater;

wherein the first sub-heater heats the substrate in combination with the main-heater, the surface of the second sub-heater heats the liner at the same temperature, or lower temperature, than the surface of first sub-heater;

wherein each temperature of the main-heater, the first sub-heater, and the second sub-heater is individually controlled.

12. The film-forming apparatus according to claim 11, wherein the main-heater has a disk-shaped in-heater;

a ring-shaped out-heater provided above the in-heater and at the position corresponding to the periphery of the substrate;

wherein each temperature of the in-heater and the out-heater are individually controlled.

13. The film-forming apparatus according to claim 11, further comprising:

at least one other sub-heater for heating the liner at the same temperature, or a lower temperature, than the surface of first sub-heater;

wherein the other sub-heater is provided above the second sub-heater, and the temperature of the other sub-heater is controlled independently of the first sub-heater and the second sub-heater.

14. The film-forming apparatus according to claim 12, further comprising:

at least one other sub-heater for heating the liner at the same temperature, or a lower temperature, than the surface of first sub-heater;

wherein the other sub-heater is provided above the second sub-heater, and the temperature of the other sub-heater is controlled independently of the first sub-heater and the second sub-heater.

15. A method for forming a film comprising:

placing a substrate on a susceptor in a liner provided between an inner wall of a film-forming chamber and a space for performing the film-forming process in the film-forming chamber;

heating the substrate to form a film onto the surface of the substrate;

wherein the substrate is heated by a main-heater from the bottom side, the substrate is heated by a first sub-heater from the top side, the first sub-heater is provided between the liner and the inner wall, apart from the inner wall and above an outer periphery of the susceptor;

wherein an output of the main-heater is controlled depending on the temperature of the substrate, and an output of the first sub-heater is controlled depending on the output of the main-heater; and wherein the liner is heated by a second sub-heater, a surface temperature of the sub-heater is same as or lower than a surface temperature of the first sub-heater, and the second sub-heater is provided between the liner and the inner wall above the first sub-heater.

* * * * *